United States Patent
Tsai et al.

(10) Patent No.: US 10,823,691 B2
(45) Date of Patent: Nov. 3, 2020

(54) SENSOR, COMPOSITE MATERIAL AND METHOD OF MANUFACTURING THE SAME

(71) Applicant: Winbond Electronics Corp., Taichung (TW)

(72) Inventors: Ming-Chih Tsai, Taichung (TW); Yu-Hsuan Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/862,634

(22) Filed: Jan. 5, 2018

(65) Prior Publication Data

US 2018/0195992 A1    Jul. 12, 2018

(30) Foreign Application Priority Data

Jan. 11, 2017   (CN) .......................... 2017 1 0021060
Dec. 14, 2017   (CN) .......................... 2017 1 1334995

(51) Int. Cl.
*H01B 1/24*    (2006.01)
*G01N 27/12*   (2006.01)
(Continued)

(52) U.S. Cl.
CPC ............ *G01N 27/126* (2013.01); *B05D 1/36* (2013.01); *B05D 5/04* (2013.01); *B81B 3/0089* (2013.01);
(Continued)

(58) Field of Classification Search
CPC .. G01N 27/126; G01N 27/223; G01N 27/121; G01N 27/127; B81B 3/0089;
(Continued)

(56) References Cited

U.S. PATENT DOCUMENTS 5,028,481 A * 7/1991 Stramel ................. H01B 1/127
                                                      428/323
5,264,157 A * 11/1993 Bidan .................. C08G 61/124
                                                     252/519.21
(Continued)

FOREIGN PATENT DOCUMENTS

CN        101977985        2/2011
CN        105977384        9/2016
(Continued)

OTHER PUBLICATIONS

"Office Action of Taiwan Counterpart Application", dated Aug. 14, 2018, p. 1-p. 6.

*Primary Examiner* — Mark Kopec
*Assistant Examiner* — Jaison P Thomas
(74) *Attorney, Agent, or Firm* — JCIPRNET

(57) ABSTRACT

A sensor, a composite material and a method of manufacturing the same are provided. The sensor includes a first electrode, a second electrode, and a sensing material layer. The first electrode and the second electrode are separated from each other. The sensing material layer is located between the first electrode and the second electrode and covers the first electrode and the second electrode. The sensing material layer includes the composite material including a conductive polymer and a metal oxide. The conductive polymer has a hydrophilic end. The metal oxide is connected to the hydrophilic end of the conductive polymer. The metal oxide includes a metal oxide precursor.

19 Claims, 5 Drawing Sheets

(51) Int. Cl.
| | |
|---|---|
| *B05D 5/04* | (2006.01) |
| *C08K 3/04* | (2006.01) |
| *B81B 3/00* | (2006.01) |
| *C08K 3/08* | (2006.01) |
| *B05D 1/36* | (2006.01) |
| *C08J 7/04* | (2020.01) |
| *B82Y 30/00* | (2011.01) |
| *B05D 3/02* | (2006.01) |
| *G01N 27/22* | (2006.01) |
| *B05D 5/08* | (2006.01) |
| *B05D 1/02* | (2006.01) |

(52) U.S. Cl.
CPC ............... *C08J 7/0427* (2020.01); *C08K 3/04* (2013.01); *C08K 3/08* (2013.01); *H01B 1/24* (2013.01); *B05D 1/02* (2013.01); *B05D 3/0254* (2013.01); *B05D 5/08* (2013.01); *B05D 2301/00* (2013.01); *B82Y 30/00* (2013.01); *G01N 27/121* (2013.01); *G01N 27/127* (2013.01); *G01N 27/223* (2013.01)

(58) Field of Classification Search
CPC ........... C08J 7/047; C08J 7/0427; C08K 3/04; C08K 3/08; C08K 3/22; H01B 1/24; B82Y 30/00; B01N 27/121; B01N 27/127; B05D 1/02; B05D 1/36; B05D 2301/00; B05D 3/0254; B05D 5/04; B05D 5/08
USPC ......................................................... 252/500
See application file for complete search history.

(56) References Cited

U.S. PATENT DOCUMENTS

| | | |
|---|---|---|
| 5,378,407 A | 1/1995 | Chandler et al. |
| 2004/0234839 A1* | 11/2004 | Wakizoe ............. H01M 4/8663 429/480 |
| 2016/0086737 A1* | 3/2016 | Kim ..................... H01G 9/2031 136/256 |

FOREIGN PATENT DOCUMENTS

| | | | | |
|---|---|---|---|---|
| CN | 106531892 | | 3/2017 | |
| JP | 2004-524396 | * | 8/2004 | ..... Y10T 428/31931 |
| JP | 2006191040 | | 7/2006 | |
| TW | 201005754 | | 2/2010 | |
| TW | 201218416 | | 5/2012 | |
| TW | I453926 | | 9/2014 | |
| TW | 201218416 A | * | 5/2015 | |
| WO | 2007007735 | | 1/2007 | |
| WO | 2015169243 | | 11/2015 | |

* cited by examiner

SENSOR, COMPOSITE MATERIAL AND METHOD OF MANUFACTURING THE SAME

CROSS-REFERENCE TO RELATED APPLICATION

This application claims the priority benefit of China application serial no. 201710021060.5, filed on Jan. 11, 2017, and China application serial no. 201711334995.5, filed on Dec. 14, 2017. The entirety of the above-mentioned patent application is hereby incorporated by reference herein and made a part of this specification.

BACKGROUND OF THE INVENTION

1. Field of the Invention

The invention relates to a sensor, a composite material, and a method of manufacturing the same.

2. Description of Related Art

In recent years, due to the industrial development and the rising awareness of healthcare and environmental protection, sensing technologies, such as technologies of gas sensing, ultraviolet light sensing, temperature sensing, humidity sensing and the like, are now under proactive development. In order to reduce the size and increase the sensitivity of a sensor, interdigitated electrodes are commonly used in the known sensor. However, in the case of a sensor with one hundred pairs of interdigitated electrodes, for example, the resistance of the sensor is still excessively high (approximately at the level of hundreds of MΩ), so the sensitivity of the sensor is still lower than expected. Hence, how to reduce the resistance of the sensor and facilitate the sensitivity thereof has become an issue to work on.

SUMMARY OF THE INVENTION

Embodiments of the invention provides a composite material suitable for a sensing material layer of a sensor. The composite material is capable of effectively reducing a resistance of the sensor and increasing a sensitivity of the sensor.

One or some embodiments of the invention provide a sensor including a first electrode, a second electrode, and a sensing material layer. The second electrode and the first electrode are separated from each other. The sensing material layer is located between the first electrode and the second electrode and covers the first electrode and the second electrode. The sensing material layer includes a conductive polymer and a metal oxide. The conductive polymer has a hydrophilic end. The metal oxide is connected to the hydrophilic end of the conductive polymer. The metal oxide includes a metal oxide precursor.

One or some embodiments of the invention provides a composite material suitable for a sensing material of a sensor. The composite material includes a conductive polymer and a metal oxide. The conductive polymer has a hydrophilic end and forms a colloidal particle in a solvent. The metal oxide is connected to the hydrophilic end of the conductive polymer.

One or some embodiments of the invention provide a method of manufacturing a composite material. The method includes the following: A conductive polymer having a hydrophilic end is provided. A metal oxide is added, such that the metal oxide is connected to the hydrophilic end of the conductive polymer. The metal oxide is obtained by subjecting a metal oxide precursor to a dehydration reaction, a polymerization reaction, a condensation reaction, or a combination thereof.

Based on the above, the composite material according to the embodiments of the invention includes the conductive polymer and the metal oxide, and the metal oxide is connected to the hydrophilic end of the conductive polymer. Hence, in the composite material according to the embodiments of the invention, in addition to having a desirable conductivity, the hydrophilic ends of the conductive polymer do not readily react with ambient water vapor and oxygen since the metal oxide blocks the hydrophilic ends of the conductive polymer. Therefore, conductive polymer degradation and coating inconvenience are alleviated. Besides, the composite material according to the embodiments of the invention is applicable to a sensing material layer of a sensor. The composite material is capable of effectively reducing the resistance of the sensor and increasing the sensitivity of the sensor.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
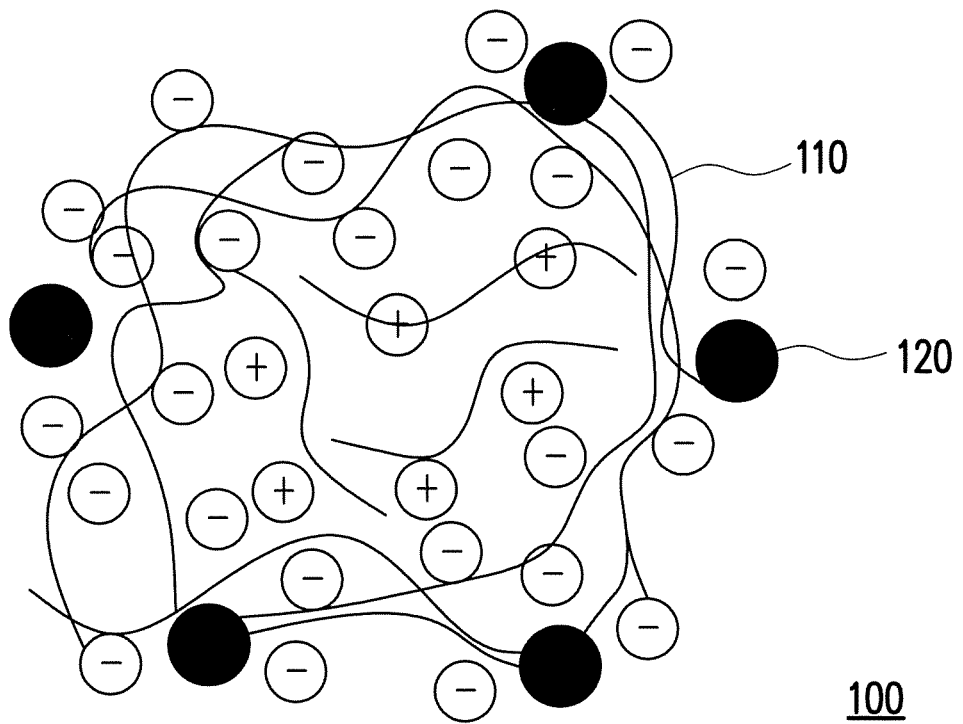
FIG. 1A is a schematic diagram of a composite material shown according to some embodiments of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
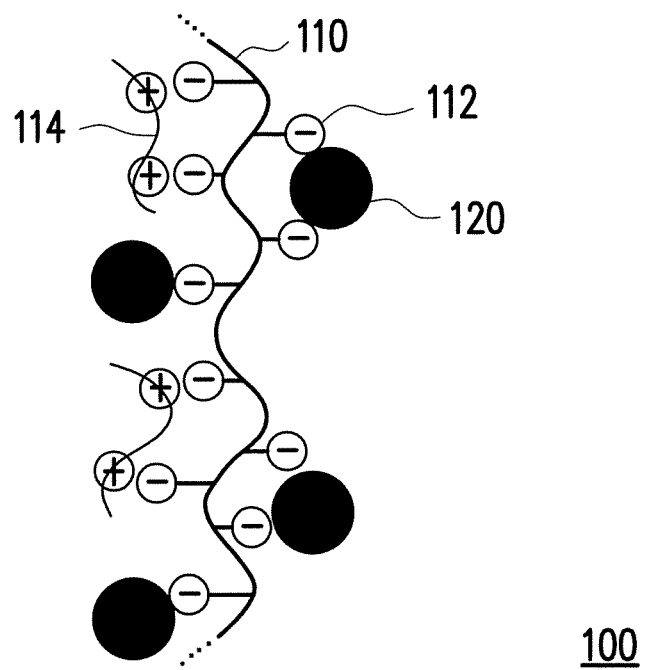
FIG. 1B is an enlarged schematic diagram of a portion of the composite material shown according to FIG. 1A.

FIG. 1A is a schematic diagram of a composite material shown according to some embodiments of the invention. FIG. 1B is an enlarged schematic diagram of a portion of the composite material shown according to FIG. 1A.

Referring to FIG. 1A and FIG. 1B, a composite material 100 according to an embodiment of the invention includes a conductive polymer 110 and a metal oxide 120. The details are as follows.

The conductive polymer 110 may be a polymer carrying positive charge and negative charge. In other words, the conductive polymer 110 has a hydrophilic end and a hydrophobic end. In some embodiments, the long carbon chain (with hydrophobicity) of the conductive polymer 110 has a plurality of functional groups which are hydrophilic ends 112, such as a carboxyl group, hydroxyl group, sulfonic acid group, amino group, or a combination thereof, but the invention is not limited thereto. For instance, in some embodiments, the conductive polymer 110 is, for instance, formed by one type of conductive polymer, wherein the hydrophobic long carbon chain of the conductive polymer 110 carries a plurality of the hydrophilic ends 112, and the hydrophilic ends 112 may be connected to the metal oxide 120. In some other embodiments, the conductive polymer 110 is, for instance, formed by two types of conductive polymers, wherein the long carbon chain is formed by a conductive polymer having a plurality of the hydrophilic ends 112 on a side chain, and the hydrophilic ends 112 may be connected to the other type of conductive polymer having a plurality of hydrophobic ends 114, and may also be connected to the metal oxide 120, but the invention is not limited thereto.

Specifically, the conductive polymer 110 includes a conjugated polymer and an acidic solubilizer. In an embodiment, the conjugated polymer may be a main conductive structure, such as poly(3,4-ethylenedioxythiophene) (PEDOT), polyphenylene sulfide (PPS), polypyrrole (PPy), polythiophene (PT), polyaniline (PANI), or a combination thereof. The acidic solubilizer may be poly(styrensulfonate) (PSS), acetic acid, propionic acid, butyric acid, benzoic acid, or a combination thereof. In some embodiments, the conjugated polymer (such as PEDOT) is not easily soluble to a solvent (such as water). However, after the acid solublizer is added, the conductive polymer 110 (such as PEDOT:PSS) may be dispersed in an aqueous solution as a colloid or a colloidal particle.

In some embodiments, the conductive polymer 110 dispersed in the solvent may form a colloid particle. The solvent includes a polar solvent, such as water, methanol, ethanol, propanol, isopropanol, butanol, ethylene glycol, diethylene glycol, glycerol, propylene glycol, dipropylene glycol, tripropylene glycol, or a combination thereof. The diameter of the colloidal particle formed by the conductive polymer 110 is, for instance, between 10 nanometers and 500 nanometers. In some embodiments, the weight-average molecular weight (Mw) of the conductive polymer 110 is, for instance, between 20000 g/mol and 500000 g/mol.

In a specific embodiment, the conductive polymer 110 is PEDOT:PSS, for example. In the embodiment, PEDOT is the main conductive structure. PSS is P-type doped, and the hydrophilic ends 112 on the side chain of PSS are sulfonic acid groups carrying negative charge (SO3$^-$). The sulfonic acid groups carrying negative charge of PSS allows PEDOT to carry positive charge (S$^+$) and to be connected with S$^+$ carrying positive charge on PEDOT. In addition, PSS may also be connected with the metal oxide 120. In the embodiment, the ratio of PEDOT:PSS is, for instance, in a range from 1:1 and 1:10, but the invention is not limited thereto.

The metal oxide 120 may block the hydrophilic ends 112 of the conductive polymer 110. In some embodiments, the metal oxide 120 is connected to the hydrophilic ends 112 of the conductive polymer 110 to block the hydrophilic ends 112. In some embodiments, the size (diameter or length) of the metal oxide 120 is less than that of the conductive polymer 110. The metal oxide 120 is, for instance, titanium dioxide ($TiO_2$), tin dioxide ($SnO_2$), zinc oxide (ZnO), tungsten trioxide ($WO_3$), iron oxide ($Fe_2O_3$), niobium pentoxide ($Nb_2O_5$), indium tin oxide (ITO), indium trioxide ($In_2O_3$), strontium titanate ($SrTiO_3$), nickel oxide (NiO), vanadium oxide ($V_2O_5$), molybdenum oxide ($MoO_3$), magnesium oxide, aluminum oxide, or a combination thereof.

In an embodiment, the metal oxide 120 is obtained by subjecting a metal oxide precursor to a dehydration reaction, a polymerization reaction, a condensation reaction, or a combination thereof. In an embodiment, the metal oxide precursor may be in the form of solution, and include at least one metal ion and a ligand. Specifically, the metal oxide precursor including the metal ion (such as titanium) and the ligand (such as isopropoxide) may be dissolved in a solvent (such as water) containing an auxiliary agent (such as an acid, an alkali, an oxidizer, or a combination thereof) to form a metal oxide precursor solution (such as an isopropoxide titanium solution). Then, a heating process is performed to the metal oxide precursor to form a metal oxide (e.g., titanium oxide) through dehydration and polymerization. In an embodiment where water is adopted, for example, the temperature of the heating process ranges from 20° C. to 90° C., and the duration of the heating process ranges from 0.5 hours to 96 hours. However, the invention is not limited thereto. In some alternative embodiments, the parameter (e.g., time or temperature) of the heating process is determined based on the type of the solvent.

In an embodiment, the ligand includes a bidentate ligand or an alkoxide ligand. The metal ion is an ion of at least one element selected from a group consisting of Ba, Co, Cu, Fe, In, Ti, Sn, Sr, V, W, Zn, Mo, Nb, N, Mg, and Al. The bidentate ligand is at least one ligand selected from a group consisting of acetate, acetylacetonate, carbonate and oxalate. The alkoxide ligand is at least one ligand selected from a group consisting of methoxide, ethoxide, propoxide, isopropoxide, and butoxide.

The shape of the metal oxide 120 includes, for instance, a granular or fibrous shape. In some embodiments, referring to FIG. 1A, the shape of the metal oxide 120 is, for instance, granular. In an embodiment in which the metal oxide 120 is granular, the diameter of the metal oxide 120 is, for instance, in a range from 1 nanometer to 20 nanometers. In some embodiments, the ratio of the diameter of the colloidal particle formed by the conductive polymer 110 to the diameter of the metal oxide 120 is, for instance, between 5:1 and 500:1. In some other embodiments, the ratio of the diameter of the colloidal particle formed by the conductive polymer 110 to the diameter of the metal oxide 120 is, for instance, 10:1. In other words, the diameter of the colloidal particle formed by the conductive polymer 110 is greater than the diameter of the metal oxide 120. In some embodiments, the diameter of the colloidal particle formed by the conductive polymer 110 may be greater than the diameter of the metal oxide 120 by 10 times or more, but the invention is not limited thereto. In a specific embodiment, the conductive polymer 110 is, for instance, PEDOT:PSS, and the diameter of the colloidal particle formed thereby is, for instance, 33 nanometers, and the metal oxide 120 is, for instance, titanium oxide, tungsten oxide, molybdenum oxide, or vanadium oxide, and the diameter thereof is, for instance, about 3 nanometers. In other words, in the present embodiment, the diameter of the colloidal particle formed by the conductive polymer 110 is greater than the diameter of the metal oxide 120 by 10 times or more, but the invention is not limited thereto.

Referring to FIG. 1B, the metal oxide 120 in the composite material 100 of the invention is connected to the hydrophilic ends 112 of the conductive polymer 110. In other words, the hydrophilic ends 112 of the conductive polymer 110 may be blocked by the connection to the metal oxide 120. In some embodiments, the metal oxide 120 may block all of the hydrophilic ends 112 of the conductive polymer 110 and expose the hydrophobic ends. In some other embodiments, the metal oxide 120 may be connected to a portion of the hydrophilic ends 112 of the conductive polymer 110 and another portion of the hydrophilic ends 112 of the conductive polymer 110 is exposed, but the invention is not limited thereto. The mole ratio of the conductive polymer 110 to the metal oxide 120 may be adjusted based on certain conditions (such as the degree of connection of the metal oxide 120 to the hydrophilic ends of the conductive polymer 110). For instance, in some embodiments, the ratio of the weight percentages of the conductive polymer 110 to the metal oxide 120 is, for instance, between 0.01:1 and 250:1. In a specific embodiment, the conductive polymer 110 is, for instance, PEDOT:PSS, and the metal oxide 120 is, for instance, vanadium oxide. In the present embodiment, to connect all of the hydrophilic ends of the conductive polymer 110 to the metal oxide 120, the ratio of the weight percentages of the conductive polymer 110 to the metal oxide 120 under such conditions is, for instance, 0.01:1 to 250:1, but the invention is not limited thereto.

The metal oxide 120 may be connected to the hydrophilic ends 112 of the conductive polymer 110 in various ways to block the hydrophilic ends 112 of the conductive polymer 110. In some exemplary embodiments, the metal oxide 120 is, for instance, connected to the hydrophilic ends 112 of the conductive polymer 110 by a hydrogen bond or a chemical bond (such as a covalent bond). In a specific embodiment, the metal oxide 120 (such as [—V═O] on vanadium oxide) forms a covalent bond (such as [—V—O—SO$_2$—]) with the hydrophilic ends (such as [—SO$_3$—] on PSS) of the conductive polymer 110 such that the hydrophilic ends 112 of the conductive polymer 110 are blocked to reduce or prevent the reaction with ambient water vapor and oxygen. In other words, the metal oxide 120 of the embodiment is able to prevent the conductive polymer 110 from reacting with ambient water vapor and oxygen, so as to alleviate deterioration and coating inconvenience of the conductive polymer 110.

Figure 2A:
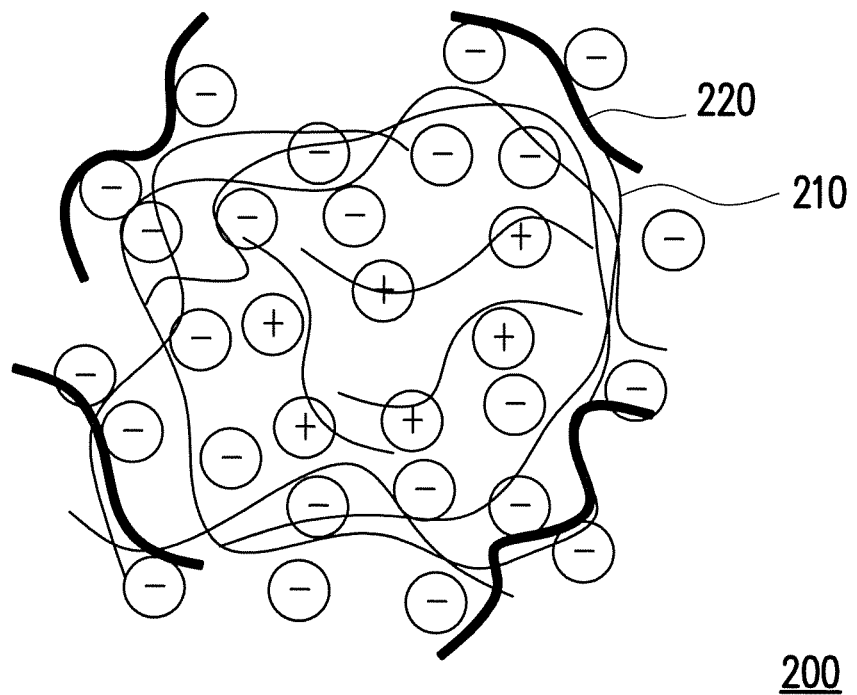
FIG. 2A is a schematic diagram of a composite material shown according to some other embodiments of the invention.
Figure 2B:
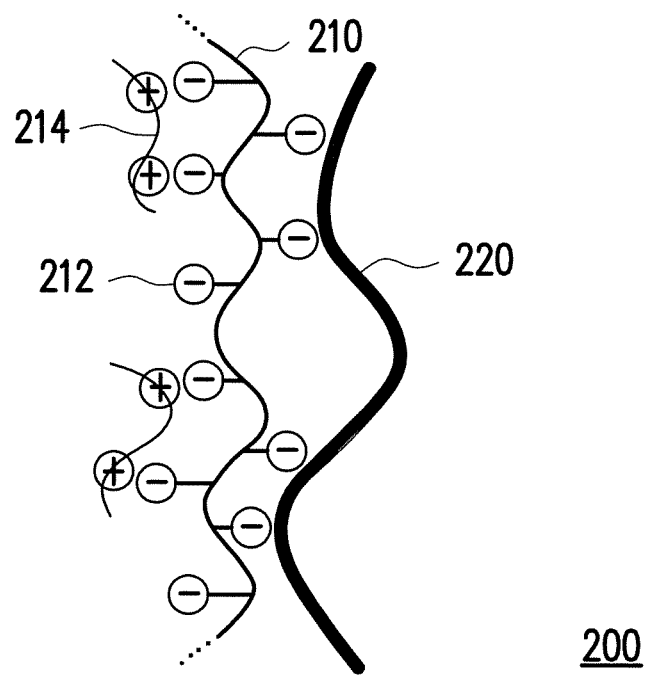
FIG. 2B is an enlarged schematic diagram of a portion of the composite material shown according to FIG. 2A.

FIG. 2A is a schematic diagram of a composite material shown according to some other embodiments of the invention. FIG. 2B is an enlarged schematic diagram of a portion of the composite material shown according to FIG. 2A.

Referring to FIG. 2A and FIG. 2B, a composite material 200 includes a conductive polymer 210 and a metal oxide 220, wherein the conductive polymer 210 has a hydrophilic end 212 and a hydrophobic end 214, and the metal oxide 220 is connected to the hydrophilic end 212 of the conductive polymer 210. The present embodiment is different from the above embodiments in that the shape of the metal oxide 220 is fibrous. In some embodiments, the ratio of the diameter of the colloidal particle formed by the conductive polymer 210 to the length of the metal oxide 220 is, for instance, between 3:1 and 100:1. In some exemplary embodiments, the length of the metal oxide 220 is, for instance, between 5 nanometers and 500 nanometers. In some embodiments, the diameter of the colloidal particle formed by the conductive polymer 210 is greater than the length of the metal oxide 220. In an exemplary embodiment, the diameter of the colloidal particle formed by the conductive polymer 210 may be greater than the length of the metal oxide 220 by 10 times or more, but the invention is not limited thereto. In a specific embodiment, the conductive polymer 210 is, for instance, PEDOT:PSS, the diameter of the colloidal particle formed thereby is, for instance, about 33 nanometers, the metal oxide 220 is, for instance, titanium oxide, tungsten oxide, molybdenum oxide, or vanadium oxide, and the length thereof is, for instance, about 14 nanometers. In other words, in the present embodiment, the diameter of the colloidal particle formed by the conductive polymer 210 is, for instance, greater than the length of the metal oxide 220 by 2.5 times or more, but the invention is not limited thereto.

It should be mentioned that, in the composite material according to the embodiments of the invention, the conductive polymers 110 and 210 have the function of providing the desired conductivity in the overall composite materials 100 and 200. For instance, in some embodiments, the conductive polymers 110 and 210 may increase the conductivity of the overall composite materials 100 and 200. In a specific embodiment, the sheet resistance of the conductive polymers 110 and 210 is, for instance, between 200Ω/□ and 3000Ω/□, the sheet resistance of the metal oxides 120 and 220 is, for instance, between 200 kΩ/□ and 200 MΩ/□, and the sheet resistance of the overall composite materials 100 and 200 is, for instance, between 30Ω/□ and 600Ω/□, but the invention is not limited thereto.

Moreover, in the composite materials 100 and 200 of the invention, the conductive polymers 110 and 210 have the function of maintaining or adjusting the work function in the overall composite materials 100 and 200. For instance, in some embodiments, the conductive polymers 110 and 210 may maintain the work function of the overall composite materials 100 and 200. In some embodiments, the work function of the conductive polymers 110 and 210 is, for instance, between 4.8 eV and 5.2 eV, the work function of the metal oxides 120 and 220 is, for instance, between 5.2 eV and 5.7 eV, and the work function of the overall composite materials 100 and 200 is, for instance, between the above two work functions, such as between 5.0 eV and 5.6 eV, but the invention is not limited thereto. In other words, the metal oxides 120 and 220 may also adjust the work function of the overall composite materials 100 and 200 to achieve the desired values.

Formation of the composite materials 100 and 200 includes, for instance, evenly mixing a metal oxide or a precursor thereof and a conductive polymer in a solvent at the above ratio to produce a conductive polymer-metal oxide composite material. In some embodiments, the solvent includes a polar solvent, such as water, methanol, ethanol, propanol, isopropanol, butanol, ethylene glycol, diethylene glycol, glycerol, propylene glycol, dipropylene glycol, tripropylene glycol, or a combination thereof. The mixing includes shaking or stirring, and may further include heating or applying ultrasonic waves to facilitate mixing, for example. Specifically, the metal oxide in a solution state and the conductive polymer in the solution state are evenly mixed. In an embodiment, the mixing may include mixing through oscillation by a vortex mixer, mixing through rotation by a rotator mixer, mixing through rolling by a tube roller mixer, mixing through oscillation by a linear/orbital shaker or a rock shaker, mixing through stiffing by a DC stirrer, or mixing through stirring by a magnetic stirrer. In an embodiment, a mixing time is at least one second, and a mixing temperature ranges from 4° C. to 80° C.

Moreover, in the composite material according to the embodiments of the invention, since the metal oxide blocks the hydrophilic ends of the conductive polymer, the hydrophilic ends of the conductive polymer do not readily react with ambient water vapor and oxygen, such that conductive polymer degradation and coating inconvenience are alleviated. Moreover, since the hydrophilic ends of the conductive polymer are blocked, the composite material may overall be hydrophobic in comparison to the original conductive polymer to increase the adhesion between the composite material according to the embodiments of the invention and the hydrophobic material. Moreover, in the composite material according to the embodiments of the invention, the conductive polymer is located in the metal oxide. In other words, the metal oxide is dispersed in the conductive polymer such that the metal oxide is not readily aggregated. Therefore, issues caused by the aggregation of the metal oxide can be prevented. Specifically, since the phenomenon of aggregation of the metal oxide is reduced, the film-forming properties of the overall composite material can be reinforced, and therefore surface roughness and surface pinholes, etc., can be reduced so as to prevent power leakage or corona discharge when an electric field is applied.

Based on the above, the composite material according to the embodiments of the invention may be adopted in a 3D printing technique of a wet process such as ink-jet and aerosol-jet, and may be applied in a plastic substrate as a conductive material or a sensing material, the plastic substrate may include a polyethylene terephthalate (PET), polyethylene naphthalate (PEN), polyimide (PI), polyvinyl chloride (PVC), polypropylene (PP), cyclo olefin polymer (COP), or polyethylene (PE).

Moreover, the composite material according to the embodiments of the invention may also be applied in an organic photoelectric semiconductor device such as an organic solar cell or an organic light emitting diode. For instance, the composite material according to the embodiments of the invention may be adopted as an electron or electron hole buffer layer of a solar cell. Hereinafter, examples in which the composite material according to the embodiments of the invention is applied in a solar cell are described, but the application of the composite material according to the embodiments of the invention is not limited thereto.

Figure 3:
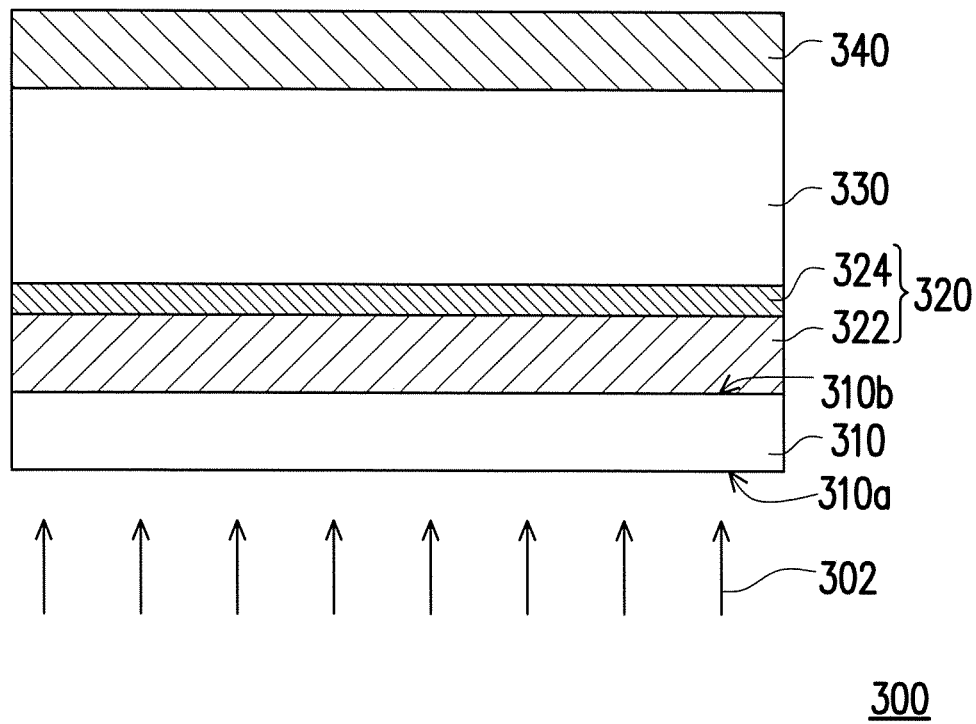
FIG. 3 is a cross-sectional schematic diagram of an application of a composite material for a solar cell shown according to some embodiments of the invention.

FIG. 3 is a cross-sectional schematic diagram of an application of a composite material for a solar cell shown according to some embodiments of the invention.

Referring to FIG. 3, a solar cell 300 may sequentially include a substrate 310, a first conductive layer 320, an active layer 330, and a second conductive layer 340, wherein the first conductive layer 320 further includes an electrode layer 322 and a buffer layer 324. Specifically, a first surface 310a of the substrate 310 is the incident surface of a light 302, and the first conductive layer 320 (including the electrode layer 322 and the buffer layer 324), the active layer 330, and the second conductive layer 340 are sequentially disposed on a second surface 310b of the substrate 310 opposite to the first surface 310a.

In some embodiments, the substrate 310 is, for instance, a transparent substrate. The material of the substrate 310 includes, for instance, glass, transparent resin, or other suitable materials. Referring further to FIG. 3, the active layer 330 is located on the buffer layer 324. In some embodiments, the material of the active layer 330 includes, for instance, poly(3-hexylthiophene) (P3HT) or [6,6]-phenyl-C61-butyric acid methyl ester (PCBM). The second conductive layer 340 is located on the active layer 330. In some embodiments, the material of the second conductive layer 340 includes, for instance, metal. The metal is, for instance, gold, silver, copper, aluminum, or titanium, but the invention is not limited thereto.

The first conductive layer 320 is located between the substrate 310 and the active layer 330. The first conductive layer 320 includes the electrode layer 322 and the buffer layer 324. In other words, in the present embodiment, the electrode layer 322 is located on the second surface 310b of the substrate 310, and the buffer layer 324 is located between the electrode layer 322 and the active layer 330. The material of the electrode layer 322 includes, for instance, indium tin oxide (ITO) or indium zinc oxide (IZO), but the invention is not limited thereto. The material of the buffer layer 324 in the present embodiment may adopt the composite material 100 or 200 in the above embodiments of the invention (refer to FIG. 1A or FIG. 2A). The buffer layer 324 may be formed by spin coating, for example. The application of the composite material according to the embodiments of the invention in the buffer layer 324 of the solar cell 300 can provide good conductivity and the desired work function, and is suitable for the transfer of electron holes (or electrons). Moreover, since the metal oxide in the composite material blocks the hydrophilic ends of the conductive polymer, material stability can be increased to facilitate coating, and the adhesion between the buffer layer 324 and a hydrophobic material can be increased. Moreover, since the metal oxide in the composite material is dispersed in the conductive polymer, power leakage or corona discharge caused by the aggregation of metal oxides can be prevented.

The embodiments above apply the composite material according to the embodiments of the invention to the conductive polymer layer of a solar cell. However, the invention is not limited thereto. The composite material according to the embodiments of the invention may also be applied in a sensor.

Figure 4:
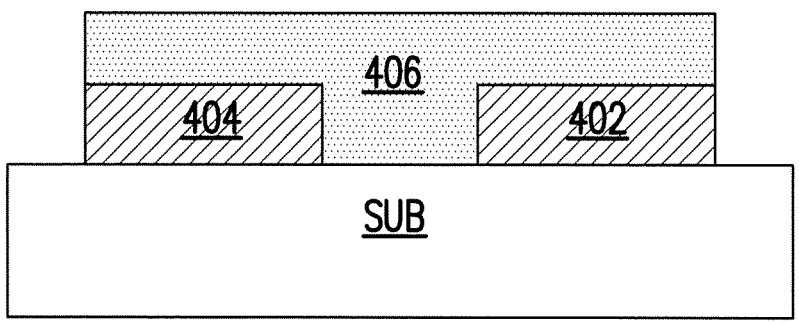
FIG. 4 is a cross-sectional schematic diagram of an application of a composite material in a sensor shown according to some embodiments of the invention.

FIG. 4 is a cross-sectional schematic diagram of an application of a composite material in a sensor shown according to some embodiments of the invention.

Referring to FIG. 4, a sensor 400 of the embodiment includes a substrate SUB, a first electrode 402, a second electrode 404, and a sensing material layer 406. In an embodiment, the substrate SUB may be a silicon substrate, a glass substrate, a silicon-on-insulator (SOI) substrate, a circuit substrate, the plastic substrate, or a combination thereof.

As shown in FIG. 4, the first electrode 402 and the second electrode 404 are disposed on the substrate SUB. Specifically, the first electrode 402 and the second electrode 404 are separated from each other and do not contact each other. In the embodiment, the first electrode 402 and the second electrode 404 may be configured as interdigitated electrodes. However, the invention does not intend to limit the shapes of the first electrode 402 and the second electrode 404, as long as a predetermined distance is provided between the first electrode 402 and the second electrode 404, and the first electrode 402 and the second electrode 404 are separated without contacting each other. In some other embodiments, the first electrode 402 and the second electrode 404 may also be stacked electrodes. The three-dimensional configuration of the stacked electrodes effectively facilitates the density of the sensor and reduce the overall device size. Specifically, the stacked electrode is formed by alternately stacking a plurality of electrode layers and a plurality of dielectric layers (not shown) vertically on the substrate SUB. In other words, at least one dielectric layer is interposed between two adjacent electrode layers to electrically isolate the two adjacent electrode layers. In an embodiment, the electrode layer includes a conductive material. The conductive material may be a doped or undoped polysilicon material, a metal material, or a combination thereof. The material of the dielectric layer may be silicon oxide, silicon nitride, or a combination thereof.

In an embodiment, the sensing material layer 406 is located at a gap between the first electrode 402 and the second electrode 404 and extends to cover top surfaces of the first electrode 402 and the second electrode 404. While the sensing material layer 406 shown in FIG. 4 does not completely cover all the surfaces of the first electrode 402 and the second electrode 404, the invention is not limited thereto. In other embodiments, the sensing material layer 406 may also completely cover all the surfaces of the first electrode 402 and the second electrode 404, including the top and side surfaces. It should be noted that, when an object under test is attached to or contacts a surface of the sensing material layer 406, the object under test may react with the sensing material layer 406. Accordingly, an electrical property, such as capacitance or resistance, of the sensing material layer 406 between the first electrode 402 and the second electrode 404 may be changed. Then, the user may conduct calculation to find out the type of the object under test or a parameter variation of the object under test based on the changed electrical property, such as capacitance or resistance.

In an embodiment, the sensing material layer 406 may be a gas sensing layer, a light sensing layer, a humidity sensing layer, a temperature sensing layer, or a combination thereof. In other words, the sensor 400 of the embodiment may be configured to sense gas, light, humidity, temperature, or a combination thereof.

In an embodiment, the sensing material layer 406 may be formed by non-contact printing, for example. In an embodiment, the non-contact printing includes inkjet printing or aerosol jet printing. Aerosol jet printing, for example, relies on an aerosol jet deposition head to form an annularly propagating jet formed of an outer sheath flow and an inner aerosol-laden carrier flow. In an annular aerosol jet process, an aerosol stream having the sensing material is concentrated and deposited on the planar or non-planar substrate SUB. Then, through a heating or photochemical treatment, the sensing material layer 406 is formed. Such process is referred to as a maskless mesoscale material deposition (M3D) process. In other words, the material is deposited without a mask, and a material layer after deposition has a line width ranging from 1 micrometer to 1000 micrometers.

In an embodiment, the material of the sensing material layer 406 is the composite material 100 or 200. Compositions and forming processes of the composite materials 100 or 200 are already described in the foregoing and will not be repeated in the following.

In an embodiment, by adopting the composite material 100 or 200 as the sensing material layer 406, the conductive polymer in the composite material 100 or 200 can reduce the resistance of the sensing material layer 406 and facilitate the sensitivity of the sensor 400. Compared to a known sensor, which adopts a metal oxide as the sensing material layer and is only able to sense at a high temperature (e.g., 200° C. to 400° C.), the sensor 400 of the embodiment is able to sense at room temperature (e.g., 0° C. to 50° C.). Therefore, the sensor 400 of the embodiment is applicable in most electronic apparatuses (e.g., cell phones) and does not overheat while significantly reduces the amount of power consumption (resulting from the high temperature).

Besides, in an embodiment, the metal oxide in the composite material 100 or 200 blocks the hydrophilic ends of the conductive polymer to prevent the conductive polymer from reacting with ambient water vapor and oxygen. Hence, conductive polymer degradation and coating inconvenience are alleviated. Accordingly, in the embodiment, the lifetime of the sensing material layer having the conductive polymer is lengthened. Besides, the sensing material layer may be coated on the surface of any material (i.e., a hydrophilic or hydrophobic surface) by adjusting the content of the metal oxide. Accordingly, the applicability of the sensing material layer is expanded.

In the following, several experimental examples of the invention are provided in the following to describe the invention in greater detail. Nevertheless, materials and processes described in the experimental examples in the following may be suitably modified without departing from the spirit of the invention. Hence, the scope of the invention shall not be limited or interpreted based on the following experimental examples.

Experimental Example 1

Figure 5:
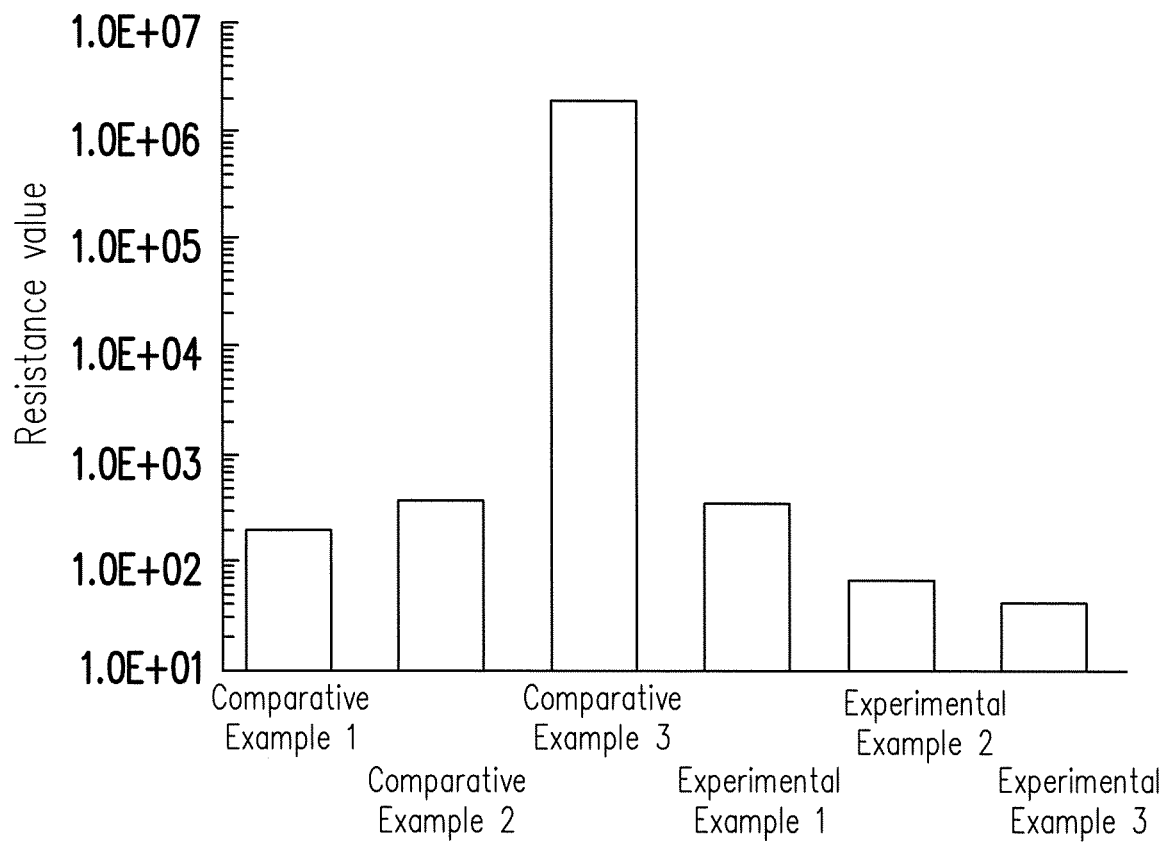
FIG. 5 is a bar graph illustrating resistances of Experimental Examples 1 to 3 and Comparative Examples 1 to 3.

In Experimental Example 1, PEDOT:PSS (purchased from Heraeus) were evenly mixed with a metal oxide by a vortex mixer and coated on an interdigitated electrode. After the mixing, a weight percentage ratio between PEDOT:PSS and the metal oxide was 1:1. The metal oxide was formed by preparing a metal oxide precursor (e.g., molybdenyl acetylacetonate) in a concentration ranging from 0.1 wt % to 10 wt % in an alcohol solution (e.g., isopropanol), heating the solution to 40° C. to 80° C., and continuously reacting for 0.05 hours to 96 hours. Then, baking was performed to form a sensing material layer on the interdigitated electrode. The baking process lasted 10 seconds to 1800 seconds, and a baking temperature ranged from 20° C. to 200° C. Then, a resistance value of the sensing material layer of Experimental Example 1 was measured, and the result is shown in FIG. 5.

Experimental Examples 2 and 3

In Experimental Examples 2 and 3, the process described in Experimental Example 1 is adopted to form sensing material layers on interdigitated electrodes. What differs from Experimental Example 1 is that the weight percentage ratio between PEDOT:PSS and the metal oxide in Experimental Example 2 was 2.25:1. The weight percentage ratio between PEDOT:PSS and the metal oxide in Experimental Example 3 was 6:1. Then, resistance values of the sensing material layers of Experimental Examples 2 and 3 were measured, and the results are shown in FIG. 5.

Comparative Example 1

In Comparative Example 1, PEDOT:PSS of 1.0 wt % (purchased from Heraeus) was coated on an interdigitated electrode. Then, baking was performed to form a sensing material layer on the interdigitated electrode. The baking process lasted 10 seconds to 1800 seconds, and a baking temperature ranged from 20° C. to 200° C. Then, a resistance value of the sensing material layer of Comparative Example 1 was measured, and the result is shown in FIG. 5.

Comparative Example 2

In Comparative Example 2, a metal oxide solution of 1.0 wt % (purchased from Sigma-Aldrich) was coated on an interdigitated electrode. Then, baking was performed to form a sensing material layer on the interdigitated electrode. The baking process lasted 10 seconds to 1800 seconds, and a baking temperature ranged from 20° C. to 200° C. Then, a resistance value of the sensing material layer of Comparative Example 2 was measured, and the result is shown in FIG. 5.

Comparative Example 3

In Comparative Example 3, a metal oxide solution of 1 wt % was coated on an interdigitated electrode. The metal oxide solution was formed by preparing a precursor of the metal oxide (e.g., molybdenyl acetylacetonate) in a concentration ranging from 0.1 wt % to 10 wt % in an alcohol solution (e.g., isopropanol), heating the solution to 40° C. to 80° C., and continuously reacting for 0.05 hours to 96 hours. Then, baking was performed to form a sensing material layer on the interdigitated electrode. The baking process lasted 10 seconds to 1800 seconds, and a baking temperature ranged from 20° C. to 200° C. Then, a resistance value of the sensing material layer of Comparative Example 3 was measured, and the result is shown in FIG. 5.

As shown in FIG. 5, compared with Comparative Examples 2 and 3, the sensing materials layers added with conductive polymer (PEDOT:PSS) in Experimental Examples 1 to 3 have lower resistance values. Besides, compared with the sensing material layer of Comparative Example 1 with only PEDOT:PSS, the combination of the conductive polymer (PEDOT:PSS) and the metal oxide has an effect of synergism and provides a lower resistance value. Besides, in Experimental Examples 1 to 3, as the content of the conductive polymer (PEDOT:PSS) increases, the conductivity of the sensing material layer decreases, thereby making the sensor more sensitive.

FIGS. 6A to 6D are respectively optical microscopic photos of Comparative Example 1 and Experimental Examples 1 to 3.

Figure 6A:
FIGS. 6A to 6D are respectively optical microscopic photos of Comparative Example 1 and Experimental Examples 1 to 3.
Figure 6B:
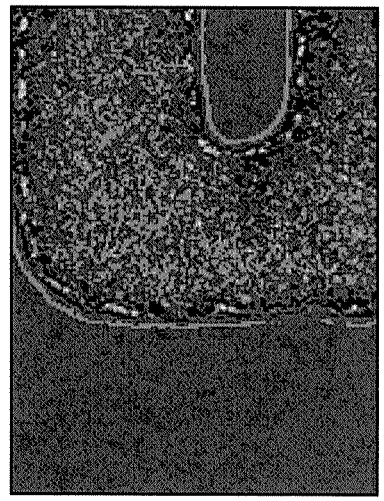
Figure 6C:
Figure 6D:
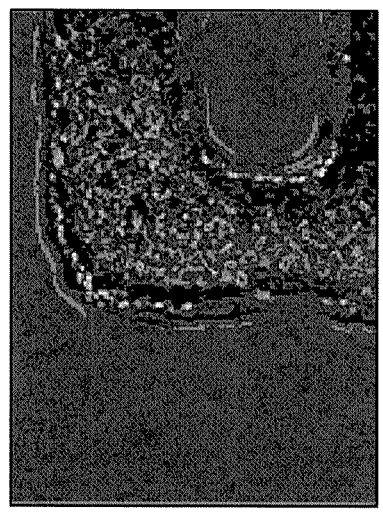

As shown in FIG. 6A, in Comparative Example 1 adopting only the metal oxide as the sensing material layer, the sensing material layer of Comparative Example 1 is less formable and prone to generate cracks. As shown in FIGS. 6B to 6D, as the content of the conductive polymer (PEDOT:PSS) increases, the sensing material layer is more formable and less prone to generate cracks. In other words, adding the conductive polymer to the sensing material layer not only reduces the resistance of the sensing material layer but also prevents the sensing material layer from generating cracks.

In view of the foregoing, the composite material according to the embodiments of the invention includes the conductive polymer and the metal oxide, and the metal oxide is connected to the hydrophilic ends of the conductive polymer. Hence, in the composite material according to the embodiments of the invention, in addition to having a desirable conductivity and work function, the hydrophilic ends of the conductive polymer do not readily react with ambient water vapor and oxygen since the metal oxide blocks the hydrophilic ends of the conductive polymer. Therefore, conductive polymer degradation and coating inconvenience are alleviated. Besides, since the hydrophilic ends of the conductive polymer are blocked, the composite material may overall be hydrophobic in comparison to the original conductive polymer to increase the adhesion between the composite material and the hydrophobic material. Moreover, the combination of the conductive polymer and the metal oxide in the composite material according to the embodiments of the invention renders an effect of synergism and may be applicable in the sensing material layer of a sensor to effectively reduce the resistance of the sensor while facilitate the sensitivity of the sensor. Furthermore, adding the conductive polymer to the sensing material layer not only reduces the resistance of the sensing material layer but also prevents the sensing material layer from generating cracks. Therefore, the reliability of the sensor is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sensor, comprising:
a first electrode;
a second electrode, separated from the first electrode; and
a sensing material layer, located between the first electrode and the second electrode and covering the first electrode and the second electrode, wherein the sensing material layer comprises:
a conductive polymer, having a hydrophilic end; and
a metal oxide, connected to the hydrophilic end of the conductive polymer, wherein the metal oxide is formed by a metal oxide precursor, and the metal oxide precursor and comprises at least one metal ion and a ligand, wherein the ligand comprises a bidentate ligand or an alkoxide ligand, and a size of the metal oxide is less than a size of the conductive polymer.

2. The sensor as claimed in claim 1, wherein the first electrode and the second electrode are arranged as interdigitated electrodes, stacked electrodes, or a combination thereof.

3. The sensor as claimed in claim 1, wherein the sensing material layer is formed by non-contact printing.

4. The sensor as claimed in claim 3, wherein the non-contact printing comprises inkjet printing or aerosol jet printing.

5. A composite material, comprising:
a conductive polymer, having a hydrophilic end and forming a colloidal particle in a solvent; and
a metal oxide, connected to the hydrophilic end of the conductive polymer, wherein the metal oxide is formed by a metal oxide precursor, and the metal oxide precursor comprises at least one metal ion and a ligand, wherein the ligand comprises a bidentate ligand or an alkoxide ligand, and a size of the metal oxide is less than a size of the conductive polymer.

6. The composite material as claimed in claim 5, wherein the metal ion is an ion of at least one element selected from a group consisting of Ba, Co, Cu, Fe, In, Ti, Sn, Sr, V, W, Zn, Mo, Nb, Ni, Mg, and Al, the bidentate ligand is at least one ligand selected from a group consisting of acetylacetonate, carbonate and oxalate, and the alkoxide ligand is at least one ligand selected from a group consisting of methoxide, ethoxide, propoxide, isopropoxide, and butoxide.

7. The composite material as claimed in claim 5, wherein the conductive polymer comprises a conjugated polymer and an acidic solubilizer, the conjugated polymer comprises poly(3,4-ethylenedioxythiophene) (PEDOT), polyphenylene sulfide (PPS), polypyrrole (PPy), polythiophene (PT), polyaniline (PANI), or a combination thereof, and the acidic solubilizer comprises poly(styrensulfonate) (PSS), acetic acid, propionic acid, butyric acid, benzoic acid, or a combination thereof.

8. The composite material as claimed in claim 5, wherein the metal oxide comprises titanium dioxide, tin dioxide, zinc oxide, tungsten trioxide, iron oxide, niobium pentoxide, indium tin oxide, indium trioxide, strontium titanate, nickel oxide, vanadium oxide, molybdenum oxide, magnesium oxide, aluminum oxide, or a combination thereof.

9. The composite material as claimed in claim 5, wherein a ratio of weight percentages between the conductive polymer and the metal oxide ranges from 0.01:1 to 250:1.

10. The composite material as claimed in claim 5, wherein the solvent comprises a polar solvent comprising water, methanol, ethanol, propanol, isopropanol, butanol, ethylene glycol, diethylene glycol, glycerol, propylene glycol, dipropylene glycol, tripropylene glycol, or a combination thereof.

11. The composite material as claimed in claim 5, wherein the metal oxide is connected to the hydrophilic end of the conductive polymer by a hydrogen bond or a covalent bond.

12. A method of manufacturing a composite material as claimed in claim 5, comprising:
providing a conductive polymer having a hydrophilic end; and
adding a metal oxide, such that the metal oxide is connected to the hydrophilic end of the conductive polymer, wherein the metal oxide is formed by a metal oxide precursor, the metal oxide precursor comprises at least one metal ion and a ligand, and the ligand comprises a bidentate ligand or an alkoxide ligand.

13. The method of manufacturing the composite material as claimed in claim 12, wherein the conductive polymer is dispersed in a solvent to form a colloidal particle, and a diameter of the colloidal particle is between 10 nanometers and 500 nanometers.

14. The method of manufacturing the composite material as claimed in claim 13, wherein a shape of the metal oxide is a granular shape.

15. The method of manufacturing the composite material as claimed in claim 14, wherein a diameter of the metal oxide is between 1 nanometer and 20 nanometers.

16. The method of manufacturing the composite material as claimed in claim 15, wherein a ratio of the diameter of the colloidal particle formed by the conductive polymer to the diameter of the metal oxide is between 5:1 and 500:1.

17. The method of manufacturing the composite material as claimed in claim 13, wherein a shape of the metal oxide is a fibrous shape.

18. The method of manufacturing the composite material as claimed in claim 17, wherein a length of the metal oxide is between 5 nanometers and 500 nanometers.

19. The method of manufacturing the composite material as claimed in claim 18, wherein a ratio of the diameter of the colloidal particle formed by the conductive polymer to the length of the metal oxide is between 3:1 and 100:1.

* * * * *